(12) United States Patent
Azumi (10) Patent No.: US 6,767,236 B2
(45) Date of Patent: Jul. 27, 2004

(54) SOCKET FOR ELECTRICAL PARTS (75) Inventor: Leo Azumi, Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 10/413,802

(22) Filed: Apr. 15, 2003

(65) Prior Publication Data
US 2004/0014346 A1 Jan. 22, 2004

(30) Foreign Application Priority Data
Apr. 16, 2002 (JP) .................................... 2002-113898

(51) Int. Cl.[7] .............................................. H01R 13/62
(52) U.S. Cl. ...................................... 439/331; 439/342
(58) Field of Search ................................ 439/331, 342, 439/330, 266, 259, 70–73

(56) References Cited

U.S. PATENT DOCUMENTS

| 5,646,447 | A | * | 7/1997 | Ramsey et al. | ............. 257/727 |
| 5,688,140 | A | * | 11/1997 | McHugh et al. | ............. 439/342 |
| 5,807,127 | A | * | 9/1998 | Ohshima | ..................... 439/266 |
| 6,106,319 | A | * | 8/2000 | Fukunaga et al. | .......... 439/342 |
| 6,293,809 | B1 | * | 9/2001 | Shimada | ....................... 439/71 |
| 6,368,137 | B1 | * | 4/2002 | Orwoll | ........................ 439/331 |
| 6,623,290 | B2 | * | 9/2003 | Tran | ............................. 439/342 |

* cited by examiner

Primary Examiner—Ross Gushi
(74) Attorney, Agent, or Firm—Lawrence E. Laubscher, Jr.

(57) ABSTRACT

A socket for electrical parts detachably holds an electrical part on a mounting portion and connects the electrical part electrically to an external circuit, and comprises an alignment mechanism which moves the electrical part to an alignment position, so that connection terminals of the electrical part can be aligned with a contact pin array, even if the electrical part has a large tolerance in outside dimensions such as with a folded package.

7 Claims, 8 Drawing Sheets

SOCKET FOR ELECTRICAL PARTS

BACKGROUND OF THE INVENTION

1. Field of the Invention

The present invention relates to a socket for electrical parts, which detachably holds an electrical part on a mounting portion thereof and connects the electrical part electrically to an external circuit, and particularly relates to a socket for electrical parts, including an alignment mechanism which moves the electrical part to an alignment position of the mounting portion, so that connection terminals of the electrical part can be aligned with a contact pin array, even if the electrical part has a large tolerance in outside dimensions.

2. Description of the Related Art

Conventional socket for electrical parts of this type comprises: a socket body on which is formed a mounting portion on which an electrical part such as an IC package is mounted, including a guiding portion which positions the electrical part by regulating a plurality of locations on a lateral surface of the electrical part mounted on the mounting portion; contact pins provided to be capable of being in contact with connection terminals of the electrical part mounted on the mounting portion; holding members each of which applies a pressure to the electrical part mounted on the mounting portion to maintain the contact of the connection terminals with the contact pins; and a socket cover which operates the pressure applying and pressure releasing mechanism of each holding member.

The guiding portion of the socket body, which regulates the plurality of locations on the lateral surface of the electrical part mounted on the mounting portion to position the electrical part, is provided in a fixed state around the mounting portion. When the electrical part is mounted on the mounting portion to be installed in the socket, the guiding portion guides the electrical part to a predetermined position. Furthermore, each holding member applies a downward pressure to the electrical part mounted on the mounting portion, thereby maintaining the contact of the connection terminals of the electrical part with the contact pins. As a result, the socket for electrical parts detachably holds the electrical part on the mounting portion, and connects the electrical part electrically to an external circuit in performance testing such as the burn-in testing for eliminating early stage failures in the electrical part or the electrical conduction test.

Figure 2:
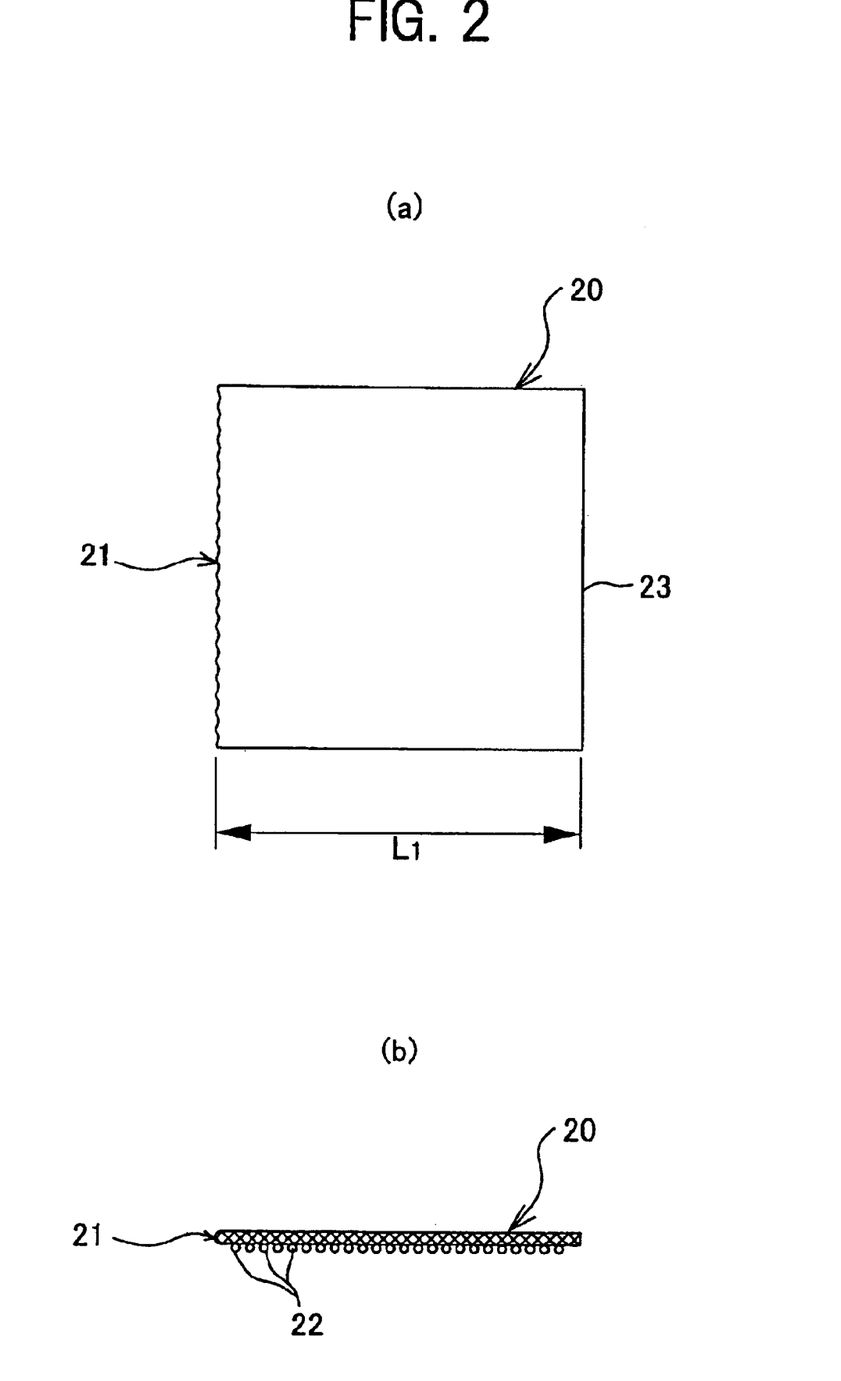
FIG. 2 is an explanatory diagram showing an appearance of a folded package.

However, in such a socket for electrical parts used in the performance testing of electrical parts, since positioning of the electrical part is performed by regulating the plurality of locations on the lateral surface of the electrical part by means of the guiding portion provided around the mounting portion, electrical parts which have large tolerances in outside dimensions sometimes cannot be positioned accurately. For example, as shown in FIG. 2, in an electrical part in the form of a so-called folded package 20 or the like formed by sealing a semiconductor substrate inside a folded flexible substrate, a folded side 21 of the folded package 20 has a larger dimensional tolerance than those of the other unfolded sides. Consequently, when the folded side 21 of the folded package 20 is regulated and positioned by the guiding portion provided around the mounting portion, the folded package 20 sometimes cannot be mounted accurately at a predetermined alignment position of the mounting portion. In such a case, a problem occurs in that each connection terminal 22 of the package 20 is not guided to a predetermined contact pin, and may be inadvertently guided to an adjacent contact pin, for example, thereby failing to ensure reliable electrical conduction between the connection terminals 22 of the folded package 20 and the contact pins, and preventing the performance testing from being carried out properly.

SUMMARY OF THE INVENTION

In order to solve the problem described above, an object of the present invention is to provide a socket for electrical parts, including an alignment mechanism which moves an electrical part to an alignment position of a mounting portion, so that connection terminals of the electrical part can be aligned with a contact pin array, even if the electrical part has a large tolerance in outside dimensions.

In order to achieve the object described above, a socket for electrical parts according to the present invention comprises: contact pins capable of being in contact with connection terminals of an electrical part; a socket body provided with a mounting portion on which the electrical part is mounted, and disposed with, on the mounting portion, an insertion position into which the electrical part is inserted, and an alignment position at which an array of the connection terminals of the electrical part is aligned with an array of the contact pins; and an alignment mechanism which moves the electrical part from the insertion position to the alignment position of the mounting portion.

With such a construction, the electrical part mounted on the mounting portion can be moved from the insertion position to the alignment position by the alignment mechanism. Consequently, even with electrical parts which have large tolerances in outside dimensions, the connection terminals of the electrical part can be aligned with the array of the contact pins, thereby ensuring reliable electrical conduction between the connection terminals of the electrical part and the contact pins, and allowing accurate performance testing to be carried out.

Further, the socket for electrical parts according to the present invention comprises holding means which are movable between a pressure applying position in which each holding means applies a pressure to the electrical part mounted on the mounting portion, and a withdrawal position in which each holding means is withdrawn from the mounting portion so as to enable to insert or remove the electrical part.

Consequently, the electrical part is mounted on the mounting portion while the holding means are in the withdrawal position, and then, the holding means are moved to the pressure applying position, to apply a pressure to the electrical part mounted on the mounting portion thereby holding the electrical part. Accordingly, it is possible to ensure reliable electrical conduction between the connection terminals of the electrical part and the contact pins.

DETAILED DESCRIPTION OF THE INVENTION

Figure 1:
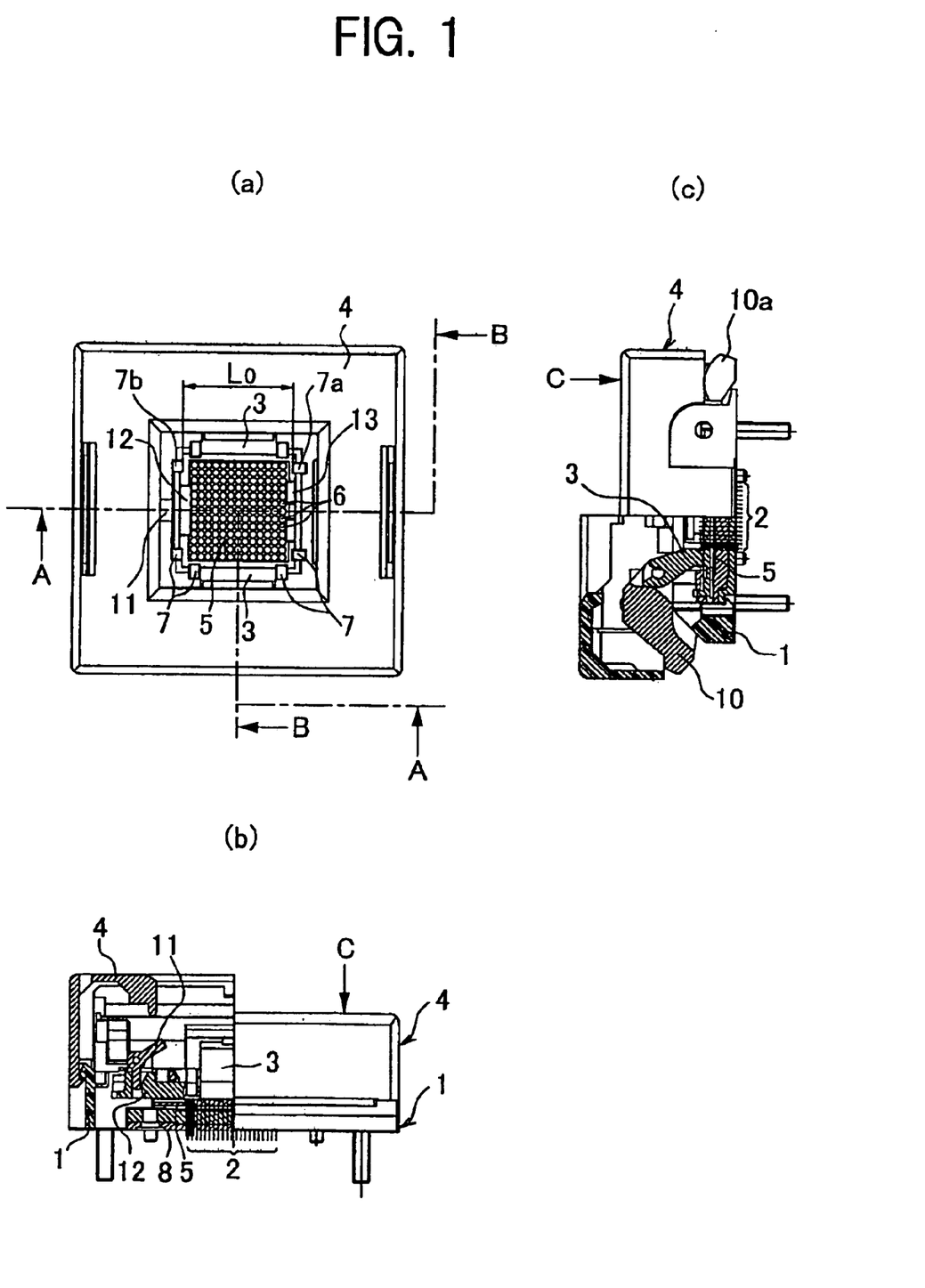
FIG. 1 is an explanatory diagram showing an embodiment of a socket for electrical parts according to the present invention, in which (*a*) is a plan view, (*b*) is a sectional view along the line A—A, and (*c*) is a sectional view along the line B—B.

FIG. 1 is an explanatory diagram showing an embodiment of a socket for electrical parts according to the present invention. In the process of performance testing of an electrical part such as a folded package 20 (see FIG. 2), for example, the socket for electrical parts is for detachably holding the folded package 20 on a mounting portion 5 and connecting the folded package 20 electrically to an external circuit, and comprises a socket body 1, contact pins 2, holding members 3 and a socket cover 4, and further comprises an alignment mechanism (11, 12 and 13).

As shown in (b) of FIG. 2, the folded package 20 serving as the electrical part is formed by folding a flexible substrate to seal a semiconductor substrate disposed with electrical wiring, inside the folded flexible substrate, and as shown in (a) of FIG. 2, a folded side 21 has a larger dimensional tolerance than those of the other unfolded sides. With such a folded package 20, only the dimensional tolerance of the folded side 21 is large, which results in insufficient accuracy, while the dimensional tolerance of the other side, for example the opposite side 23, is small and therefore sufficient accuracy is achieved. Although there are various electrical parts which can be installed in the socket for electrical parts of the present invention, such as BGA, PGA and LGA packages and the like, depending on their shape and type of connection terminals and the like, the following description uses, as an example, a BGA type folded package 20 in which multiple ball shaped connection terminals 22 are arranged on a lower surface of a package body in a matrix form, for example.

The socket body 1 shown in FIG. 1 is for mounting thereon an electrical part such as the folded package 20 to hold it, and is formed in a frame shape from a synthetic resin with high strength and excellent thermal resistance. As shown in (a) of FIG. 3, a support plate 8 accommodating the contact pins 2 is disposed at the center bottom of the socket body 1. Further, the mounting portion 5 is provided above this support plate 8. This mounting portion 5 is a site on which the folded package 20 is mounted, and is provided to be movable up and down relative to the support plate 8, and is also urged upward by a spring member (not shown) disposed between the mounting portion 5 and the support plate 8. As shown in (a) of FIG. 1, installation holes 6 receiving the connection terminals 22 (see (b) of FIG. 2) of the folded package 20 are formed in the mounting portion 5 at positions corresponding to the connection terminals 22.

Furthermore, as shown in (a) of FIG. 1, guiding portions 7 are provided around the periphery of the mounting portion 5, at its four corners for example. These guiding portions 7 regulate a plurality of locations on a lateral surface of the folded package 20 to be mounted on the mounting portion 5, to position the folded package 20, and are designed so as to guide the folded package 20 into a predetermined insertion position of the mounting portion 5. In (a) of FIG. 1, a distance $L_0$ between opposing guiding portions 7a and 7b on the right and left of the mounting portion 5 is set to be slightly larger than a width $L_1$ of the folded package 20 shown in (a) of FIG. 2. As a result, the folded package 20 mounted on the mounting portion 5 can be moved to the left and right directions. On the other hand, in (a) of FIG. 1, a distance between the guiding portions 7 positioned so as to oppose vertically with the mounting portion 5 therebetween is set to be approximately the same as a length of the folded package 20 shown in FIG. 2.

Figure 3:
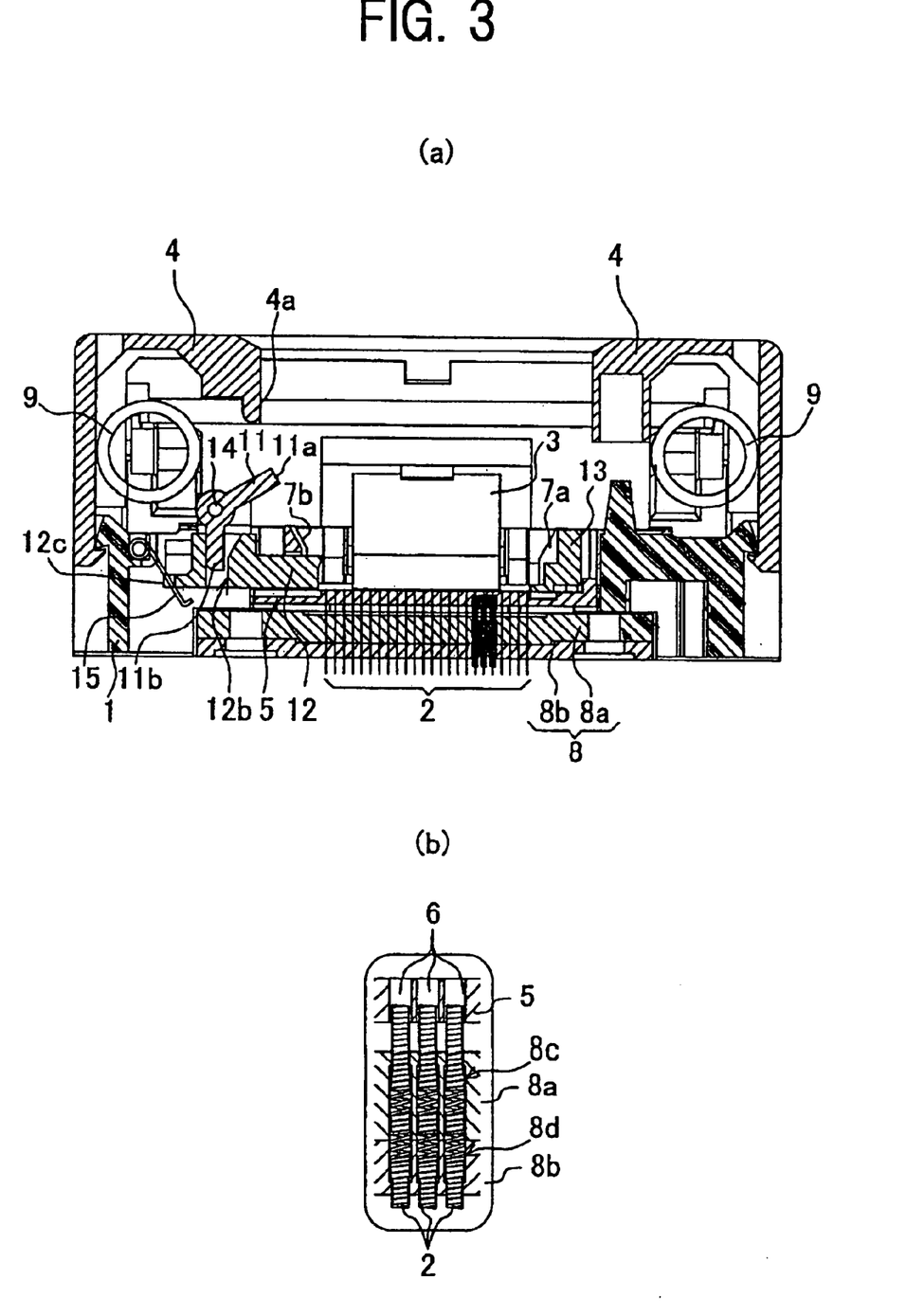
FIG. 3 is a sectional view showing the structure of the socket for electrical in a state where a socket cover is pushed upward to a raised position.

As shown in FIG. 3, the support plate 8 is a plate member for accommodating to hold the contact pins 2, and comprises an upper plate 8a and a lower plate 8b. Accommodating holes 8c and 8d are formed in the upper plate 8a and the lower plate 8b, respectively, at positions corresponding to the connection terminals 22 of the folded package 20, in the same manner as the installation holes 6 in the mounting portion 5. The contact pins 2 are accommodated within these accommodation holes 8c and 8d, and hence are held in the support plate 8.

Further, the contact pins 2 are in contact with the connection terminals 22 of the folded package 20 mounted on the mounting portion 5 to achieve an electrical connection to an external circuit (not shown in the figure), and are formed into a coil spring shape from a material with excellent electrical conductivity. As shown in (b) of FIG. 3, these contact pins 2 are attached to the socket body 1 so that lower end portions thereof protrude from a lower surface of the lower plate 8b by a predetermined amount, upper end portions thereof protrude from the upper plate 8a, and top ends of the protruding portions are positioned within the installation holes 6 of the mounting portion 5.

In addition, as shown in (c) of FIG. 1, a pair of holding members 3 serving as pressure applying members are provided above and on both sides of the mounting portion 5. These holding members 3 apply pressures to an upper surface of the folded package 20 mounted on the mounting portion 5 to hold it in a fixed state, to maintain the connection of the connection terminals 22 of the folded package 20 with the contact pins 2, and constitute a mechanism which applies and releases a pressure to the folded package 20 mounted on the mounting portion 5, linked with the movement of a socket cover 4 to be described later.

As shown in FIG. 1, the socket cover 4, serving as an operating member, is provided above the socket body 1 so as to be movable up and down relative to the socket body 1. Further, as described later, the socket cover 4 is urged upward relative to the socket body 1. This socket cover 4 operates the pressure applying and releasing mechanism of the pair of holding members 3. The socket cover 4 is in a box shape with frame, which covers the entire socket body 1, and formed with an opening through which the electrical part can be inserted or removed, in a position above the mounting portion 5. As shown in the right half of (b) of FIG. 1, when a force is applied to the socket cover 4 in the direction indicated by the arrow C, to press the socket cover 4 downward to the lowest position, the holding members 3 are opened outward, linked with this movement. As a result, the pressure on the electrical part mounted on the mounting portion 5 is released, and the electrical part can be inserted or removed through the opening of the socket cover 4.

Further, as shown in the left half of (b) of FIG. 1, when the force applied to the socket cover 4 is released, the socket cover 4 is returned to its original highest position, and as shown in the lower half of (c) of FIG. 1, the holding members 3 close inward, linked with the rising movement of the socket cover 4. As a result, the pressures can be applied to the electrical part mounted on the mounting portion 5 by the holding members 3.

In addition, reference numerals 9 in (a) of FIG. 3 indicate helical springs, connected to opening/closing members 10 (see (c) of FIG. 1) which are attached to the holding members 3 so as to allow the holding members 3 to open/close. The helical springs 9 and the opening/closing members 10 constitute the pressure applying and releasing mechanism of the holding members 3, linked with the movement of the socket cover 4. Here, the helical springs 9 are helical tension springs, and both opening/closing members 10 are urged in respective closing directions. As a result, as shown in (c) of FIG. 1, the socket cover 4 is urged upward by contacting sections 10a of the opening/closing members 10.

Here, in the present invention, as shown in (a) of FIG. 3, the alignment mechanism is provided inside the socket body 1. This alignment mechanism moves the folded package 20 mounted on the mounting portion 5 by a predetermined distance from the insertion position to an alignment position at which the connection terminals 22 of the folded package 20 are aligned with a predetermined array of contact pins 2, linked with the vertical movement of the socket cover 4, and comprises a rotating lever 11, a package pusher 12 and a floating member 13.

The rotating lever 11 is constructed to rotate, linked with the vertical movement of the socket cover 4. A specific example of the construction of this rotating lever 11, as shown in (a) of FIG. 3, has a rotating shaft 14 at the center thereof, and arm sections 11a and 11b extend outward from the rotating shaft.

Figure 5:
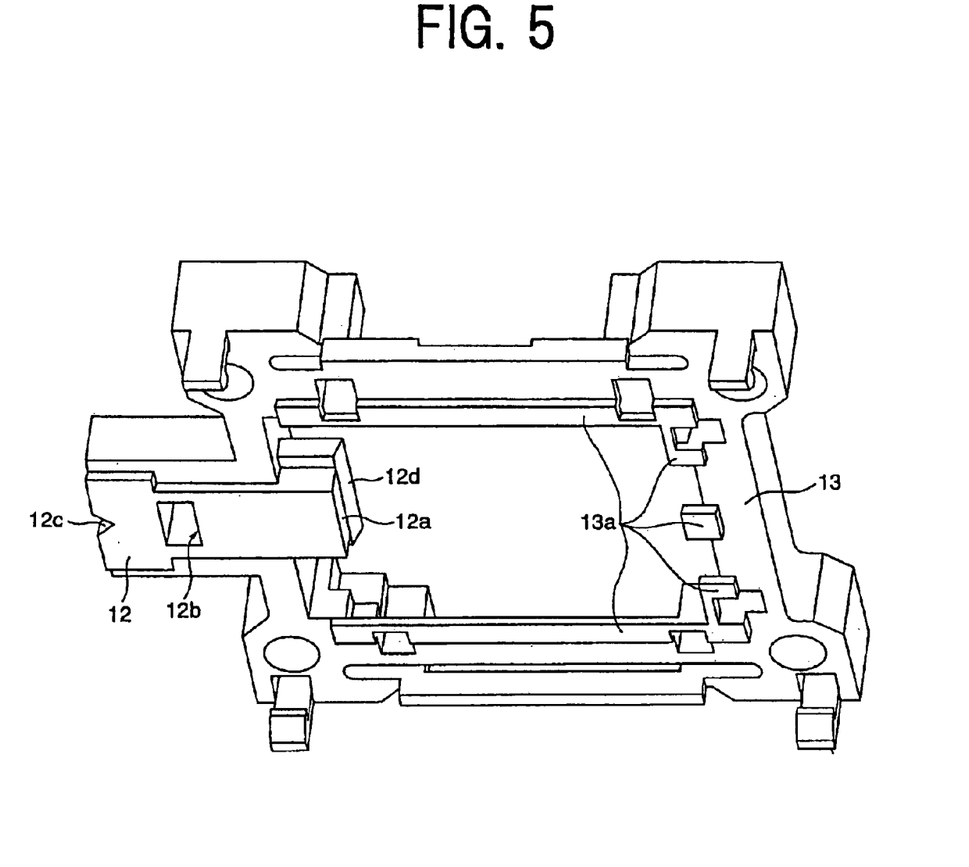
FIG. 5 is a lower side perspective view showing specific structures of a package pusher and a floating member, which constitute an alignment mechanism of the socket for electrical parts.

Further, the package pusher 12 serves as pushing means for moving the folded package 20 mounted on the mounting portion 5 in the horizontal direction, linked with the vertical movement of the socket cover 4, so that the folded package 20 abuts the guiding portion 7a in (a) of FIG. 3 provided on the right of the mounting portion 5. This package pusher 12 is attached to the floating member 13 to be described later. In a specific example of the construction of this package pusher 12, as shown in FIG. 5, the package pusher 12 is a block member of a predetermined size provided with, on the inside thereof, a surface 12a which presses against the lateral surface of the folded package 20. A rectangular hole 12b to allow the second arm section 11b of the rotating lever 11 shown in FIG. 3 to pass therethrough is provided in a position near the center of the package pusher 12, and a groove 12c which supports a spring 15 shown in (a) of FIG. 3 to prevent it from moving to the left or right is provided on the outside of the package pusher 12. This package pusher 12 is urged inward (to the right in (a) of FIG. 3) by the spring 15.

Figure 4:
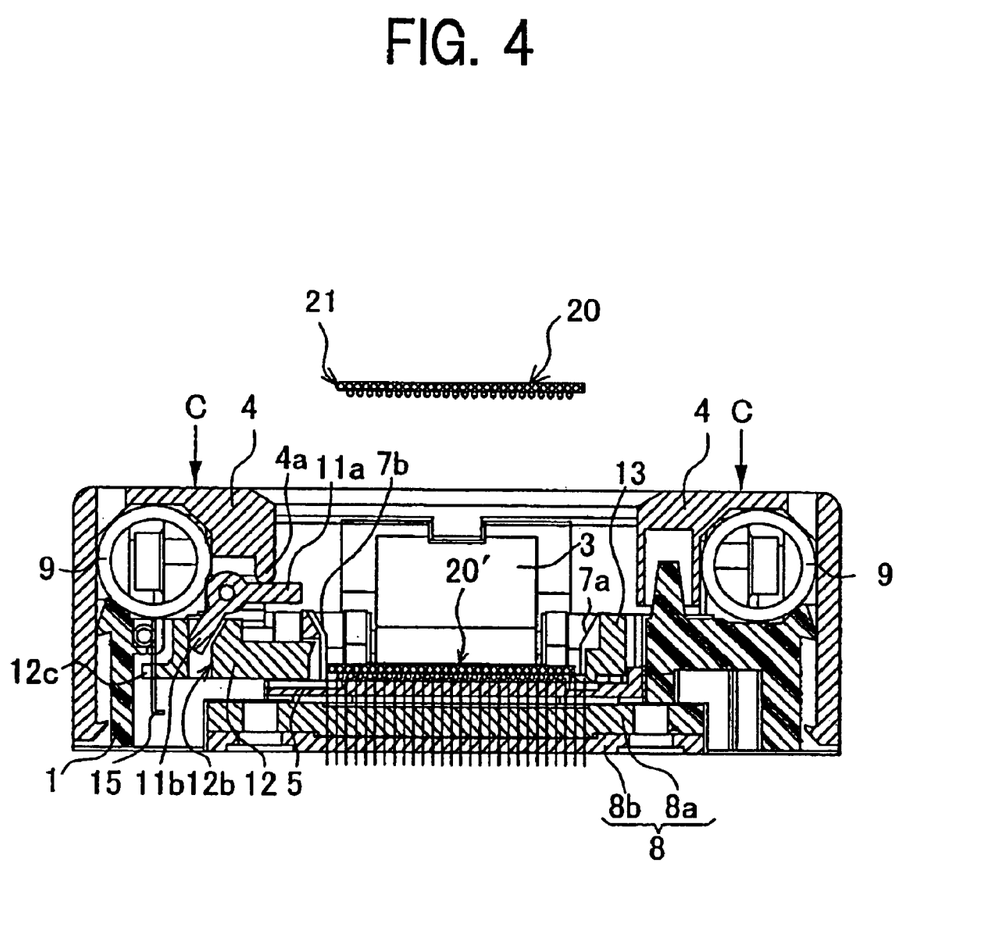
FIG. 4 is a sectional view showing the structure of the socket for electrical parts, in a state where the socket cover is pushed downward to a lowered position.

As shown in FIG. 4, when a force is applied to the socket cover 4 in the direction indicated by the arrow C, the first arm section 11a of the rotating lever 11 is pushed downward by a protruding section 4a provided on a lower surface of the socket cover 4. As a result, the rotating lever 11 is rotated clockwise in the figure, while the second arm 11b is moved away from the mounting portion 5. Accordingly, the package pusher 12 is moved horizontally away from the mounting portion 5 (to the left in FIG. 4) by the second arm 11b of the rotating lever 11, against the urging force of the spring 15.

Further, when the force applied to the socket cover 4 is released, as shown in (a) of FIG. 3, the package pusher 12 is pushed inward by the spring 15 fitted in the groove 12c provided on the outside of the package pusher 12, and is moved horizontally towards the mounting portion 5 (to the right in FIG. 3 (a)) until it reaches its original position. Consequently, the package pusher 12 can be moved horizontally, linked with the vertical movement of the socket cover 4. The rotating lever 11 and the package pusher 12 together constitute horizontal moving means for moving the folded package 20 horizontally from the insertion position to the alignment position, linked with the movement of the socket cover 4.

This horizontal moving means moves the folded package 20 to the alignment position in which the array of connection terminals 22 is aligned with a predetermined array of contact pins 2. Here, the side 23 of the folded package 20 shown in FIG. 2, which is opposite to the folded side 21, achieves sufficient accuracy. Therefore, as shown in FIG. 4, if the folded package 20 is mounted on the mounting portion 5 to be moved horizontally so that the folded side 21 is pushed by the package pusher 12, the side 23 with accuracy of the folded package 20 abuts the guiding portion 7a of the socket body 1 shown in the right side in the figure. Since the predetermined gap $L_0$ set for the distance between the guiding portions 7a and 7b of the socket body 1, the connection terminals 22 of the folded package 20 can be moved horizontally from the insertion position to the alignment position by the package pusher 12 which is moved horizontally, linked with the rising movement of the socket cover 4. Accordingly, even in the case of the folded package 20 with a large tolerance in outside dimensions, the connection terminals 22 thereof can be aligned accurately with the corresponding contact pins 2, thereby enabling reliable electrical conductivity to be ensured therebetween.

Further, when the pair of holding members 3 are opened outward, linked with the lowering movement of the socket cover 4, to release the pressure applied to the folded package 20, as shown in FIG. 4, the package pusher 12 retracts past the guiding portion 7b formed on the socket body 1 shown in the left side in the figure. As a result, the operation of insertion or removal of the folded package 20 into or from the mounting portion 5 is not obstructed by the package pusher 12. Accordingly, the operability of the socket for electrical parts can be ensured. Furthermore, as shown in FIG. 3, the package pusher 12 is constructed to be moved horizontally before the holding members 3 are closed inward to apply pressures to the folded package 20 thus holding it in a fixed state. As a result, it is possible to reliably slide the folded package 20 during a period of moving the folded package 20 from the insertion position to the alignment position of the mounting portion 5 without any influence by the pressing force of the holding members 3, and when the folded package 20 is in the alignment position of the mounting portion 5, the pressures can be applied thereto reliably by the holding members 3.

Figure 6:
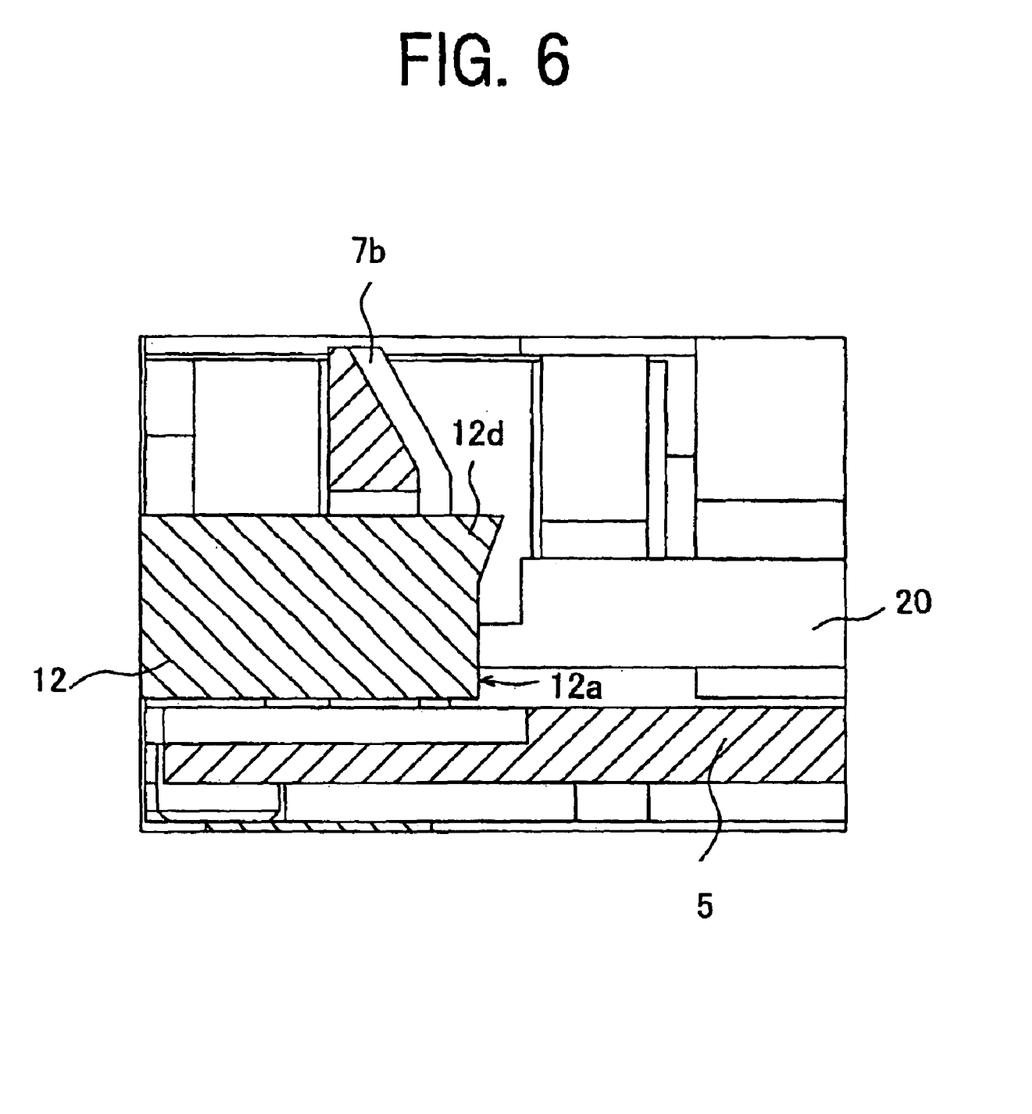
FIG. 6 is an enlarged sectional view showing a main part of a locking portion formed on the package pusher shown in FIG. 5.

In addition, as shown in FIG. 6, a locking portion 12d is formed on an upper end portion side of the surface 12a of the package pusher 12 which pushes the folded package 20. This locking portion 12d prevents the folded package 20 from coming away from the mounting portion 5, and is molded integrally with the package pusher 12, for example. Consequently, when the folded package 20 is pushed by the package pusher 12, even if a force capable of moving the folded package 20 away from the mounting portion 5 acts on the folded package 20, since the folded package 20 is kept down by the locking portion 12d of the package pusher 12, it is possible to prevent the folded package 20 from coming away from the mounting portion 5. Accordingly, the reliability during operation of the socket for electrical parts can be ensured.

Furthermore, as shown in FIG. 5, the package pusher 12 is attached to the floating member 13. This floating member 13 is formed to be movable vertically upon receiving a force due to the pressing and pressure release of the holding members 3 which are opened/closed, linked with vertical movement of the socket cover 4, and serves as floating means for receiving the folded package 20 before the mounting portion 5, to receive outside edges of the folded package 20. In a specific example of the construction of this floating member 13, as shown in FIG. 5, the floating member 13 is in a frame shape with an opening of approximately the same size as the surface of the mounting portion 5, and on inside edges thereof are formed flange shaped holder sections 13a capable of receiving the outside edges of the folded package 20, to extend from three sides of the floating member 13 excluding a side at which the package pusher 12 is provided.

A spring (not shown in the figure) is attached between the mounting portion 5 shown in FIG. 3 and the underneath of the floating member 13. The floating member 13 is pushed upward by an urging force of this spring, and is positioned above the mounting portion 5. As a result, the floating member 13 is movable vertically upon receiving the force due to the pressing and pressure release of the holding members 3. The floating member 13 formed in this manner receives the outside edges of the folded package 20, and accurately guides the connection terminals 22 of the folded package 20, which were pushed by the package pusher 12 to be moved to the alignment position where they are aligned with the array of contact pins 2, to the contact pins 2. As a result, the alignment mechanism can move the folded package 20 in a state where the folded package is supported by the floating member 13, from the insertion position to the alignment position, and also can move the folded package 20 from the insertion position to the alignment position while maintaining a non-contacting state of the folded package 20 with the mounting portion 5.

In the description above, the horizontal moving means has been described as comprising the rotating lever 11 and the package pusher 12. However, the present invention is not limited to this construction, and any construction may be used which can move the electrical part in the horizontal direction. Further, the case has been described where the package pusher 12 pushes the folded side 21 having the large tolerance of the folded package 20. However, the present invention is not limited thereto, and the folded package 20 may be moved horizontally by pushing the ball shaped connection terminals 22 directly. When there is a plurality of locations on the electrical part where the tolerance of the outside dimensions is large, for example, when the dimensional tolerance of two adjacent sides is large, horizontal moving means may be provided so as to correspond to those locations.

Next, an operation of a socket for electrical parts with such a construction will be described with reference to FIG. 4, FIG. 7 and FIG. 8. First, as in FIG. 4, a force in the direction indicated by the arrow C is applied to the socket cover 4 of the socket for electrical parts, to press the socket cover 4 downward to its lowest position. As a result, the holding members 3 are opened outward, linked with the movement of the socket cover 4, to withdraw to withdrawal positions where the folded package 20 can be inserted into or removed from the mounting portion 5, and the package pusher 12 is moved horizontally away from the mounting portion 5 via the rotation of the rotating lever 11, to retract past the guiding portion 7b of the mounting portion 5 shown in the left in FIG. 4. Consequently, the folded package 20 can be inserted in the insertion position of the mounting portion 5 by merely operating the socket cover 4. Accordingly, the insertion or removal operation of the folded package 20 in or from the mounting portion 5 can be carried out unimpeded, and the operability of the socket for electrical parts can be ensured.

In such a state, as shown in FIG. 4, with the folded side 21 of the folded package 20 facing the side at which the package pusher 12 of the floating member 13 is provided, the folded package 20 is lowered from above and inserted into the mounting portion 5. As a result, the folded package 20 is guided by the guiding portions 7 provided around the periphery of the mounting portion 5, and mounted on a position indicated by reference numeral 20' in FIG. 4 (the insertion position). At this time, the package pusher 12 does not protrude further inward than the guiding portion 7b on the left in FIG. 4, and consequently the folded package 20 is received in the floating member 13 without being contact with the package pusher 12.

Figure 7:
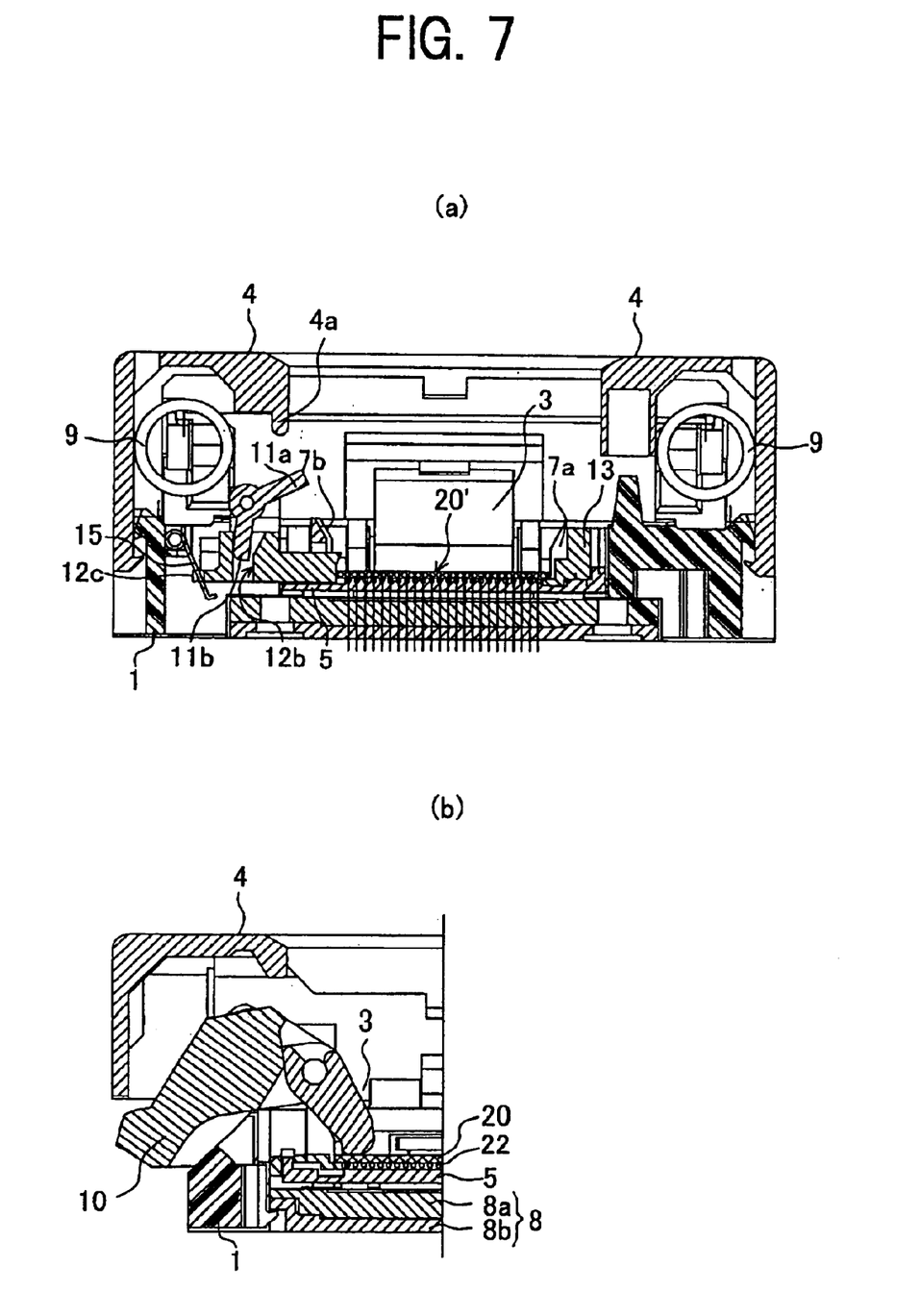
FIG. 7 is a sectional view showing the structure of the socket for electrical parts, in a state where the package pusher of the floating member starts to apply a pressure to the electrical part, linked with an upward movement of the socket cover.

When the force applied to the socket cover 4 is released, the socket cover 4 is moved upward again as shown in (a) FIG. 7. As a result, when the protruding section 4a formed on the lower surface of the socket cover 4 is moved away from the first arm section 11a of the rotating lever 11, the package pusher 12 is moved inward horizontally by the urging force of the spring 15. Accordingly, the folded package 20 received in the floating member 13 is pushed horizontally, and the dimensionally accurate side 23 opposite to the folded side 21 abuts the guiding portion 7a on the right in (a) FIG. 7. In this manner, the connection terminals 22 of the folded package 20 mounted on the mounting portion 5 are moved to the alignment position to be aligned with the predetermined array of contact pins 2.

At this time, since the locking portion 12d is formed on the upper end portion side of the surface 12a of the package pusher 12, which presses against the lateral surface of the folded package 20 (see FIG. 5), the folded package 20 does not come away from the mounting portion 5 during the horizontal movement thereof. Accordingly, the reliability of the socket for electrical parts during operation can be ensured.

Once the package pusher 12 has completed the operation of moving the connection terminals 22 of the folded package 20 to the alignment position, the socket cover (operating member) 4 rises even further as shown in (b) FIG. 7. At this time, linked with the rising movement of the socket cover 4, the holding (pressure applying) members 3 are closed inward, and the folded package 20 which is received in the holder section 13a of the floating member 13 is pressed downward. As a result, the floating member 13 is pressed downward, causing the holder section 13a of the floating member 13 to become coplanar with the mounting portion 5. At this time, the connection terminals 22 of the folded package 20 are accommodated within the installation holes 6 formed in the mounting portion 5. At this time, the connection terminals 22 of the folded package 20 and the contact pins 2 are not in contact with each other.

Figure 8:
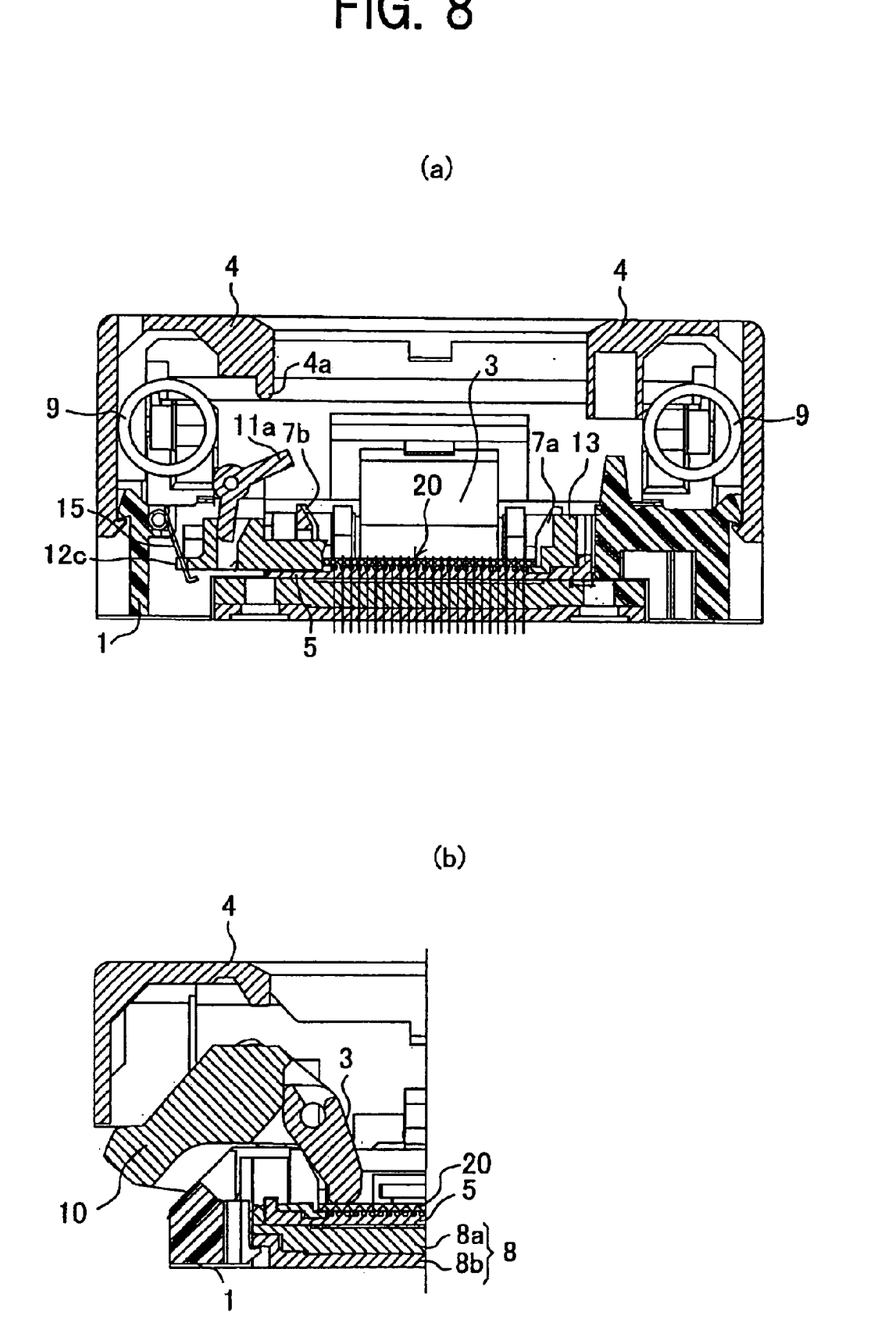
FIG. 8 is a sectional view showing the structure of the socket for electrical parts, in a state where the package pusher moves the electrical part to an alignment position and each holding member applies a pressure to the electrical part, linked with the upward movement of the socket cover.

Then, as shown in (a) FIG. 8, the socket cover 4 rises and is pushed back up to its original highest position. Consequently, as shown in (b) FIG. 8, the holding members 3 apply downward pressures to the floating member 13 and the mounting portion 5 via the folded package 20, linked with the rising movement of the socket cover 4. As a result, the connection terminals 22 of the folded package 20 and the contact pins 2 are electrically connected with each other, due to a contact pressure which is produced when the contact pins 2 are elastically deformed by a predetermined amount by the connection terminals 22 of the folded package 20. In this state, predetermined performance testing can be carried out.

Then, after completion of the predetermined performance testing, if a force in the direction indicated by the arrow C in FIG. 4 is again applied to the socket cover 4 to depress the socket cover 4 to its lowest position, the holding members 3 are withdrawn to the withdrawal position. As a result, the folded package 20 from which the downward pressure has been released is caused to rise by the spring urging the mounting portion 5 upward or the spring urging the floating member 13 upward. Further, in parallel with these operations, the package pusher 12 applying the pressure to the folded package 20 is moved outward horizontally. In this state, the folded package 20 received on top of the floating member 13 can be removed. Furthermore, when the next folded package 20 is inserted in the insertion position of the mounting portion 5 and the force applied to the socket cover 4 is released, the connection terminals 22 of the folded package 20 are moved to the alignment position, and subsequently the predetermined performance testing can be carried out.

In the description above, the example has been used in which the electrical part capable to be installed in the socket for electrical parts is a so-called BGA type folded package 20. However, the present invention is not limited thereto, and can be applied to other shaped electrical parts. For example, if the present invention is applied to a PGA type electrical part, a stroke of the floating means may be set to correspond to the length of the connection terminals of the electrical part. Furthermore, if the present invention is applied to an LGA type electrical part, the floating means need not be provided.

Moreover, the socket for electrical parts of the present invention has been described in terms of an embodiment applied to a so-called open top type socket for electrical parts in which the socket cover 4 serving as the operating member is attached to the socket body 1 to be movable up and down. However, the present invention is not limited to this embodiment, and can be applied to a so-called clam shell type socket in which an operating member, to which a pressure applying member is attached, is rotatably attached to one end of the socket body.

In addition, the present invention can also be applied to a socket for electrical parts in which the operating member is provided separately from the socket body, by providing the operating member on the side of handler used in performance testing during the semiconductor manufacturing process, and installing only the socket body on the side of tester (external circuit board).

What is claimed is:

1. A socket for electrical parts comprising:

contact pins capable of being in contact with connection terminals of an electrical part;

a socket body provided with a mounting portion on which said electrical part is mounted, and disposed with, on said mounting portion, an insertion position into which said electrical part is inserted, and an alignment position at which an array of said connection terminals of said electrical part is aligned with an array of said contact pins; and an alignment mechanism including floating means disposed with a predetermined distance relative to said mounting portion and is vertically movable for supporting and moving said electrical part from the insertion position to the alignment position of said mounting portion.

2. A socket for electrical parts according to claim 1, further comprising;

an operating member provided so as to be movable vertically relative to said socket body, wherein when said operating member is at a lowest position, said holding means is at a withdrawal position, and said electrical part can be inserted into the insertion position of said mounting portion.

3. A socket for electrical parts according to claim 1, further comprising;

holding means which are movable between a pressure applying position in which said holding means applies a pressure to said electrical part mounted on said mounting portion, and a withdrawal position in which said holding means is withdrawn from said mounting portion so as to enable to insert or remove said electrical part.

4. A socket for electrical parts according to claim 3, wherein said holding means applies a pressure to said electrical part after said electrical part is moved from the insertion position to the alignment position of said mounting portion.

5. A socket for electrical parts according to claim 1, wherein said alignment mechanism is provided with horizontal moving means for moving said electrical part horizontally from the insertion position to the alignment position.

6. A socket for electrical parts according to claim 5, wherein said horizontal moving means is provided with pushing means for pushing said electrical part in order to move said electrical part horizontally.

7. A socket for electrical parts according to claim 6, wherein said pushing means is formed with, at an upper end portion side of its site which pushes said electrical part, a locking portion which prevents said electrical part from coming away from said mounting portion.

* * * * *